(12) United States Patent
Milton et al.

(10) Patent No.: US 12,300,663 B2
(45) Date of Patent: May 13, 2025

(54) METHODS OF FORMING WIRE INTERCONNECT STRUCTURES AND RELATED WIRE BONDING TOOLS

(71) Applicant: Kulicke and Soffa Industries, Inc., Fort Washington, PA (US)

(72) Inventors: Basil Milton, Furlong, PA (US); Romeo Olida, Chalfont, PA (US); Jonathan Geller, Haifa (IL); Tomer Levinson, Ramat Yishal (IL)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/765,653

(22) Filed: Jul. 8, 2024

(65) Prior Publication Data

US 2024/0363583 A1    Oct. 31, 2024

Related U.S. Application Data

(62) Division of application No. 17/550,729, filed on Dec. 14, 2021, now Pat. No. 12,057,431.

(60) Provisional application No. 63/127,386, filed on Dec. 18, 2020.

(51) Int. Cl.
*H01L 23/00* (2006.01)

(52) U.S. Cl.
CPC .............. *H01L 24/85* (2013.01); *H01L 24/43* (2013.01); *H01L 24/745* (2013.01); *H01L 24/78* (2013.01); *H01L 2224/4383* (2013.01); *H01L 2224/43985* (2013.01); *H01L 2224/745* (2013.01); *H01L 2224/7825* (2013.01); *H01L 2224/78313* (2013.01); *H01L 2224/78315* (2013.01); *H01L 2224/78318* (2013.01); *H01L 2224/78319* (2013.01); *H01L 2224/78343* (2013.01); *H01L 2224/7855* (2013.01); *H01L 2224/85035* (2013.01); *H01L 2224/85047* (2013.01); *H01L 2224/85205* (2013.01)

(58) Field of Classification Search
CPC ....... H01L 24/745; H01L 24/78; H01L 24/85; H01L 2224/745; H01L 2224/78313; H01L 2224/78315; H01L 2224/7318; H01L 2224/78319
See application file for complete search history.

(56) References Cited

U.S. PATENT DOCUMENTS

| 3,358,898 | A | * | 12/1967 | Medkeff | ............. F16L 55/1686 228/56.3 |
| 4,415,115 | A | * | 11/1983 | James | ..................... H01L 24/85 228/180.5 |
| 4,845,354 | A | * | 7/1989 | Gupta | ..................... H01L 24/78 219/121.62 |

(Continued)

*Primary Examiner* — David A Zarneke
(74) *Attorney, Agent, or Firm* — Christopher M. Spletzer, Sr.

(57) ABSTRACT

A method of forming a wire interconnect structure includes the steps of: (a) forming a wire bond at a bonding location on a substrate using a wire bonding tool; (b) extending a length of wire, continuous with the wire bond, to a position above the wire bond; (c) moving the wire bonding tool to contact the length of wire, at a position along the length of wire, to partially sever the length of wire at the position along the length of wire; and (d) separating the length of wire from a wire supply at the position along the length of wire, thereby providing a wire interconnect structure bonded to the bonding location.

3 Claims, 9 Drawing Sheets

(56) References Cited

U.S. PATENT DOCUMENTS

| | | | | |
|---|---|---|---|---|
| 4,955,523 | A * | 9/1990 | Carlommagno | H01L 24/11 228/175 |
| 5,195,237 | A * | 3/1993 | Cray | H01R 12/523 29/838 |
| 5,364,004 | A * | 11/1994 | Davidson | H01L 24/11 228/1.1 |
| 5,516,029 | A * | 5/1996 | Grasso | H01L 24/85 228/180.5 |
| 6,206,273 | B1 * | 3/2001 | Beaman | G01R 1/0675 29/838 |
| 6,332,270 | B2 * | 12/2001 | Beaman | G01R 1/07378 324/750.05 |
| 6,687,988 | B1 * | 2/2004 | Sugiura | H01L 24/85 228/180.5 |
| 7,188,759 | B2 * | 3/2007 | Calpito | B23K 20/007 228/110.1 |
| 7,229,906 | B2 * | 6/2007 | Babinetz | H01L 24/13 257/E21.508 |
| 7,347,352 | B2 * | 3/2008 | Qin | H01L 24/48 228/180.5 |
| 7,427,009 | B2 * | 9/2008 | Lim | H01L 24/78 228/110.1 |
| 7,621,436 | B2 * | 11/2009 | Mii | H01L 24/48 228/904 |
| 8,048,720 | B2 * | 11/2011 | Calpito | H01L 24/06 438/612 |
| 9,087,815 | B2 * | 7/2015 | Haba | B23K 20/007 |
| 9,349,706 | B2 * | 5/2016 | Co | H01L 24/85 |
| 9,502,371 | B2 * | 11/2016 | Colosimo, Jr. | H01L 24/85 |
| 10,008,477 | B2 * | 6/2018 | Haba | H01L 23/3171 |
| 2005/0092815 | A1 * | 5/2005 | Mii | H01L 24/48 228/180.5 |
| 2006/0175383 | A1 * | 8/2006 | Mii | B23K 20/007 228/180.5 |
| 2007/0187467 | A1 * | 8/2007 | Toyama | H01L 24/11 228/101 |
| 2008/0197510 | A1 * | 8/2008 | Mii | B23K 20/004 257/E23.024 |
| 2013/0167373 | A1 * | 7/2013 | Hwang | H01L 24/11 29/879 |
| 2021/0035948 | A1 * | 2/2021 | Chau | H01L 21/4853 |

* cited by examiner

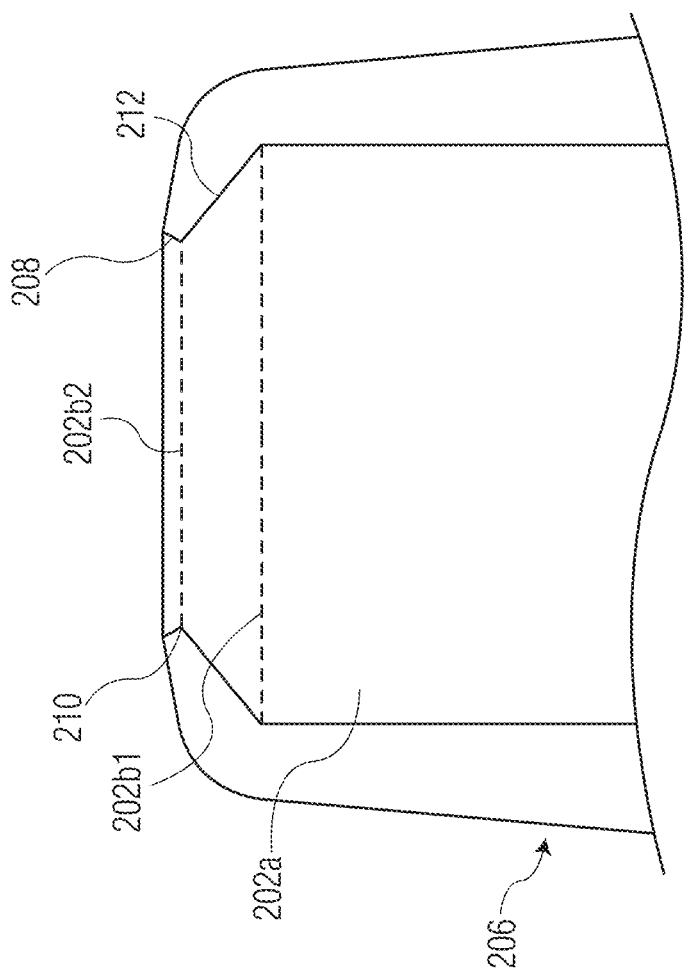
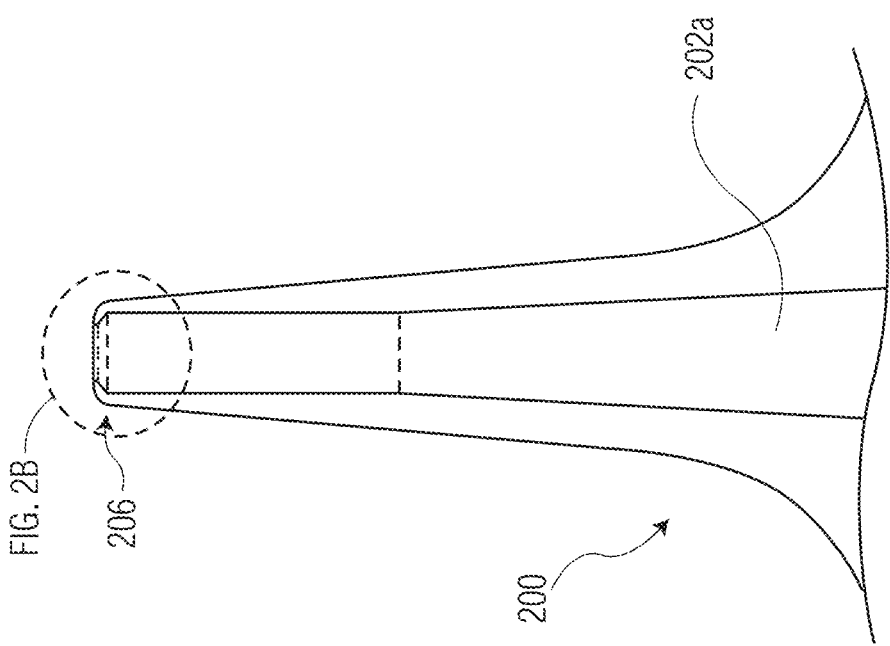
FIG. 2B
FIG. 2A

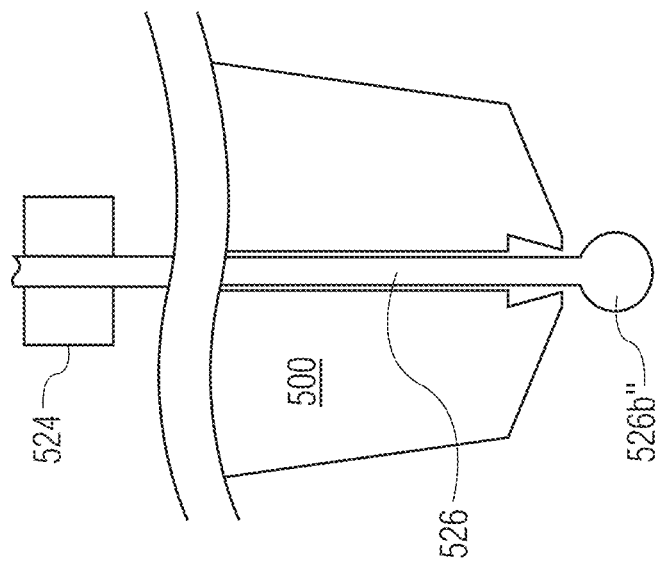
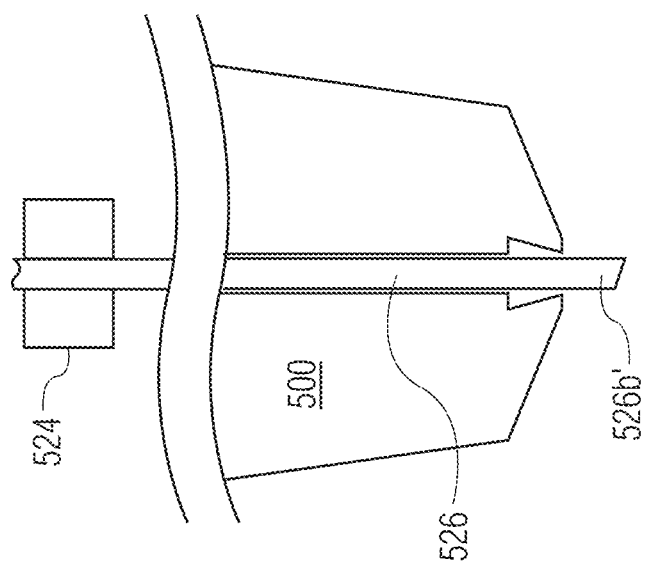

METHODS OF FORMING WIRE INTERCONNECT STRUCTURES AND RELATED WIRE BONDING TOOLS

CROSS-REFERENCE TO RELATED APPLICATIONS

This application is a divisional application of U.S. patent application Ser. No. 17/550,729, which claims the benefit of U.S. Provisional Patent Application No. 63/127,386 filed Dec. 18, 2020, the contents of both of which are incorporated herein by reference.

FIELD

The invention relates to wire bonding, and more particularly, to improved methods of forming wire interconnect structures.

BACKGROUND

A wire bonder (i.e., wire bonding machine) may form wire loops between respective locations to be electrically interconnected. Exemplary wire bonding techniques include ball bonding and wedge bonding. Steps in a ball bonding application include: bonding a free air ball to a first bond location (e.g., a die pad of a semiconductor die); extending a length of wire continuous with the bonded free air ball to a second bond location (e.g., a lead of a leadframe); and bonding the wire to the second bond location, thereby forming a wire loop between the first bond location and the second bond location. In forming the bonds between (a) the ends of the wire loop and (b) the bond sites (e.g., die pads, leads, etc.), varying types of bonding energy may be used including, for example, ultrasonic energy, thermosonic energy, thermo-compressive energy, amongst others.

Wire bonding machines have also been used to form wire contacts and interconnects having a free end. For example, U.S. Pat. No. 9,502,371 to Colosimo, Jr. et al. discloses forming wire interconnect structures. However, conventional techniques of forming such wire contacts and interconnects suffer from a lack of consistency (e.g., height consistency, shape consistency, etc.) and undesirable shapes of the wire contacts and interconnects. Further, modern devices have significant space constraints which creates a greater risk of interference between adjacent structures.

Thus, it would be desirable to provide improved methods of forming wire interconnect structures.

SUMMARY

According to an exemplary embodiment of the invention, a method of forming a wire interconnect structure includes the steps of: (a) forming a wire bond at a bonding location on a substrate using a wire bonding tool; (b) extending a length of wire, continuous with the wire bond, to a position above the wire bond; (c) moving the wire bonding tool to contact the length of wire, at a position along the length of wire, to partially sever the length of wire at the position along the length of wire; and (d) separating the length of wire from a wire supply at the position along the length of wire, thereby providing a wire interconnect structure bonded to the bonding location.

According to another exemplary embodiment of the invention a wire bonding tool is provided. The wire bonding tool includes a body portion defining a through hole extending along a length of the body portion, the through hole being configured to receive a length of wire. The through hole extends into a cavity at a tip portion of the wire bonding tool, the cavity having a diameter that varies along its length. The diameter of the cavity is larger than a diameter of the through hole. The diameter of the cavity is smaller at a working face of the wire bonding tool as compared to the diameter of the cavity adjacent the through hole.

According to yet another exemplary embodiment of the invention a wire bonding tool is provided. The wire bonding tool includes a body portion terminating at a tip portion configured to contact a wire during a wire bonding operation. The wire bonding tool defines a cutting feature (e.g., a pointed edge defined by the wire bonding tool at the tip portion) at the tip portion configured to partially sever the wire during the wire bonding operation.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 2A is a side sectional view of a portion of a wire bonding tool in accordance with an exemplary embodiment of the invention;

FIG. 2B is a detailed view of a tip portion of FIG. 2A;

FIGS. 5A-5J are block, side view diagrams of portions of a wire bonding tool and related elements illustrating a method of forming a wire interconnect structure in accordance with an exemplary embodiment of the invention.

DETAILED DESCRIPTION

As used herein, the term "interconnect structures" or "wire interconnect structures" are intended to refer to conductive structures that may be used to provide any type of electrical interconnection (e.g., a temporary interconnection as in a contact used for testing, a permanent interconnection as in a semiconductor package interconnect, electrical shielding, etc.).

Figure 1:
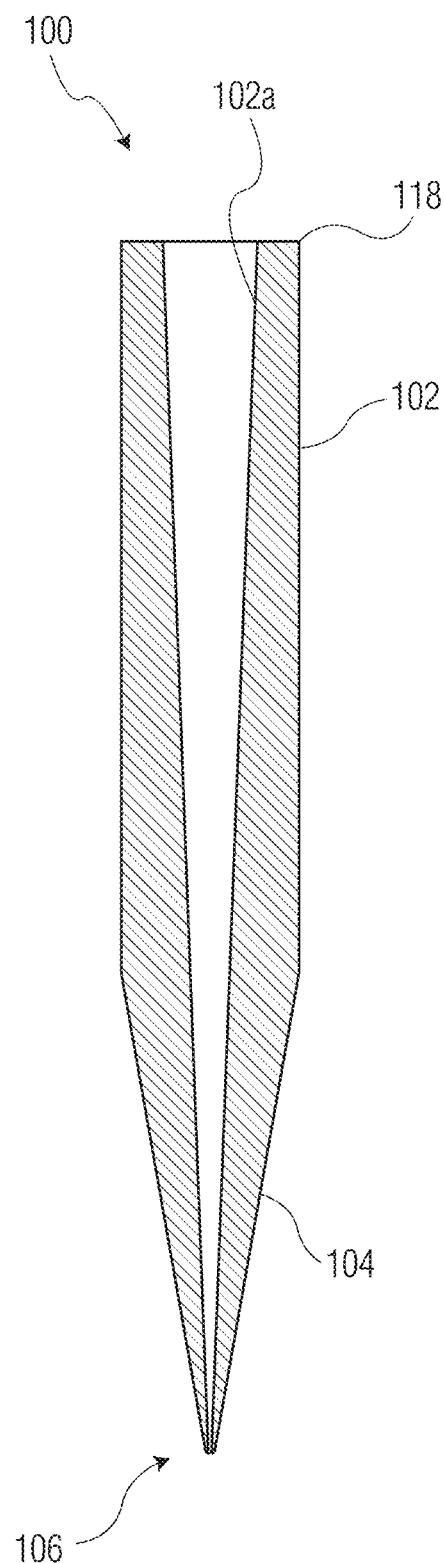
FIG. 1 is side sectional view of a wire bonding tool configured to have a tip portion in accordance with various exemplary embodiments of the invention.

FIG. 1 illustrates a wire bonding tool 100 including a body portion 102 defining a through hole 102a extending along a length of body portion 102. Through hole 102a is configured to receive a length of wire (not illustrated). Body portion 102 extends to a tapered portion 104 (e.g., a tapered portion), and terminates at a tip portion 106 configured to contact a wire during a wire bonding operation. Wire bonding tool 100 has an outer diameter 118. FIG. 1 is simply one example of a wire bonding tool that may have features in its tip portion in accordance with the invention. FIGS. 2A-2B, FIGS. 3A-3B, and FIGS. 5A-5J illustrate details of tip portions of wire bonding tools, including details of cutting features defined by a tip portion. Such tip portions may be applied to a wire bonding tool such as shown in FIG. 1, or any other wire bonding tool within the scope of the invention.

FIGS. 2A-2B illustrate a tip portion 206 of a wire bonding tool 200. FIG. 2B illustrates a feature 210 (e.g., a cutting feature, an edge portion, a pointed edge, etc.) adjacent a chamfer 208 and a through hole 202a. More specifically, feature 210 is defined at the intersection of chamfer 208 and a tapered portion 212. Feature 210 is configured to partially sever a length of wire in connection with the formation of a wire interconnect structure. FIG. 2B also illustrates through hole 202a having a diameter 202b1, and a diameter 202b2 at the location of feature 210 (where diameter 202b2 is less than diameter 202b1).

Figure 3B:
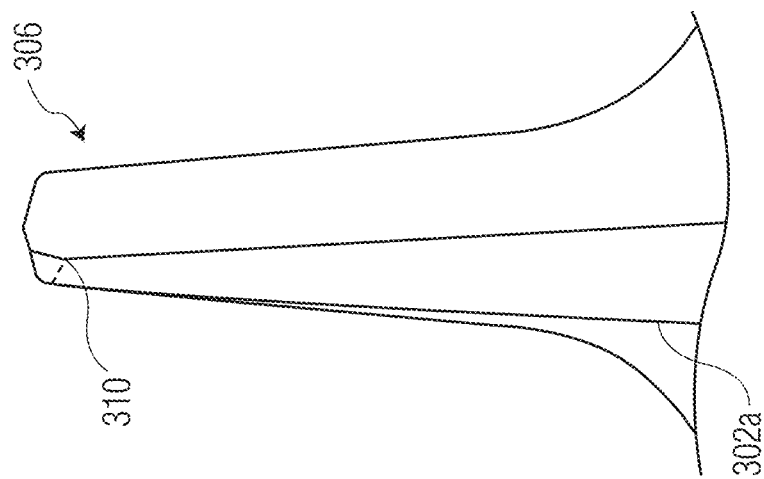
FIGS. 3A-3B are views of a tip portion of another wire bonding tool in accordance with an exemplary embodiment of the invention.
Figure 3A:
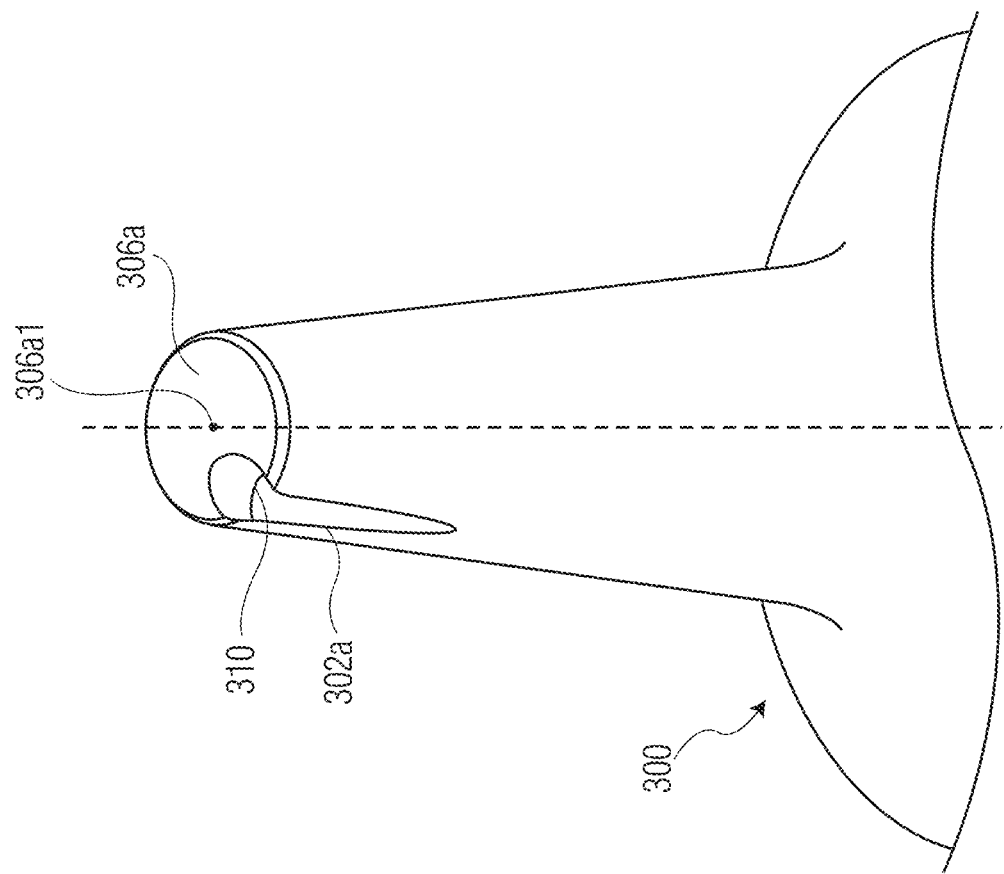

FIGS. 3A-3B illustrate a tip portion 306 of a wire bonding tool 300 including a feature 310 configured to partially sever a length of wire in connection with the formation of a wire interconnect structure. A through hole 302a (offset from a center 306a1 of tip portion 306, where tip portion includes a solid end portion 306a) is illustrated through wire bonding tool 300. Tip portion 306 defines feature 310 (e.g., a cutting feature, an edge portion, a pointed edge, etc.). Referring specifically to FIG. 3B, a cross sectional side view of a portion of wire bonding tool 300 is illustrated.

Figure 4:
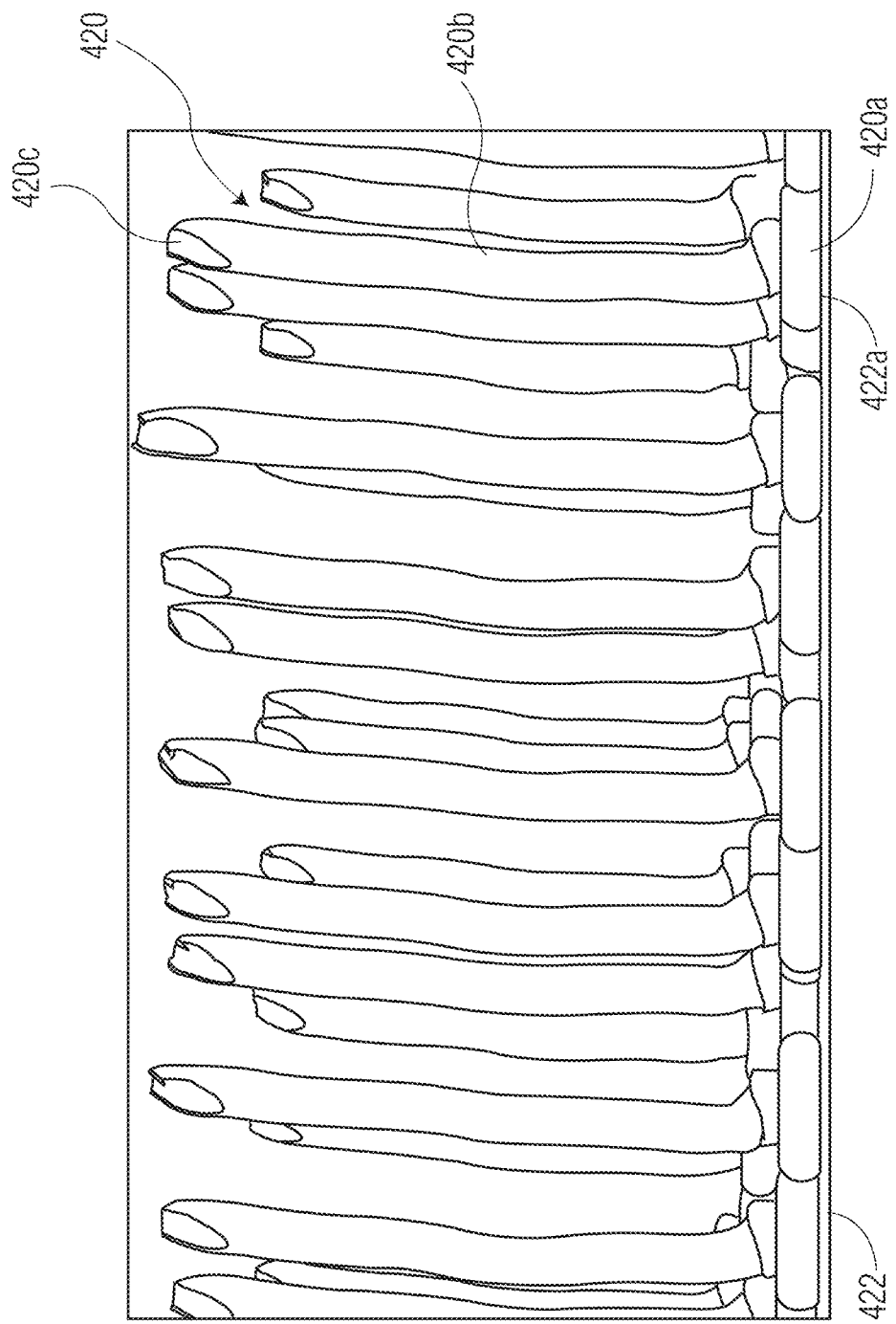
FIG. 4 is a side view of a plurality of wire interconnect structures formed using a method in accordance with an exemplary embodiment of the invention.

FIG. 4 illustrates a plurality of wire interconnect structures 420 bonded to bonding locations 422a (e.g., a lead, a bond pad, etc.) on a workpiece/substrate 422 (e.g., a leadframe, a die, etc.). Each of wire interconnect structures 420 includes a wire bond 420a (e.g., a bonded free air ball), extending to a length of wire 420b, and terminating at a free end 420c. Free end 420c illustrates a cut portion having been partially severed by a feature (e.g., a cutting feature, an edge portion, a pointed edge, etc.) of a wire bonding tool in accordance with the invention.

FIGS. 5A-5J illustrate a method of forming a wire interconnect structure in accordance with an exemplary embodiment of the invention. As will be understood by those skilled in the art, a wire bonding tool 500 (defining through hole 502a) and a wire clamp 524 are carried by a common bond head assembly (not shown for simplicity) and as such, move together, for example, along a vertical z-axis of a wire bonding machine. A wire 526 extends from a wire supply 528 through wire clamp 524 and through hole 502a. Prior to FIG. 5A, a free air ball is formed on an end of wire 526. The free air ball is seated at tip portion 506 of bonding tool 500, with wire bonding tool 500 positioned over a substrate 522 (e.g., workpiece). Substrate 522 includes bonding location 522a (e.g., a die pad, a lead, a circuits trace, etc.). The free air ball is bonded to bonding location 522a using a working face 506a and, for example, bonding force, ultrasonic energy, and heat (e.g., a heat block positioned below workpiece/substrate 522, not shown) to form wire bond 520a (i.e., a bonded free air ball 520a, sometimes referred to as a ball bond) at bonding location 522a.

Figure 5C:
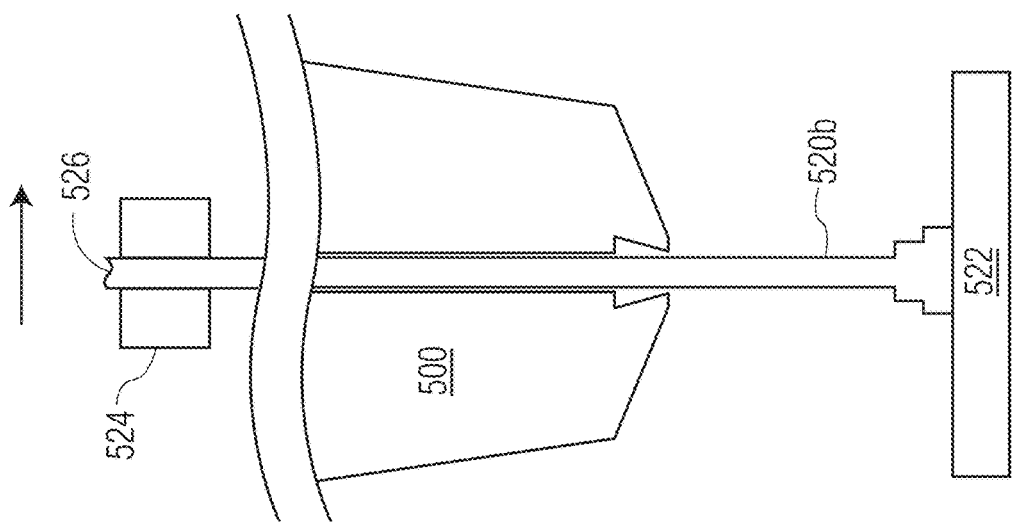
Figure 5B:
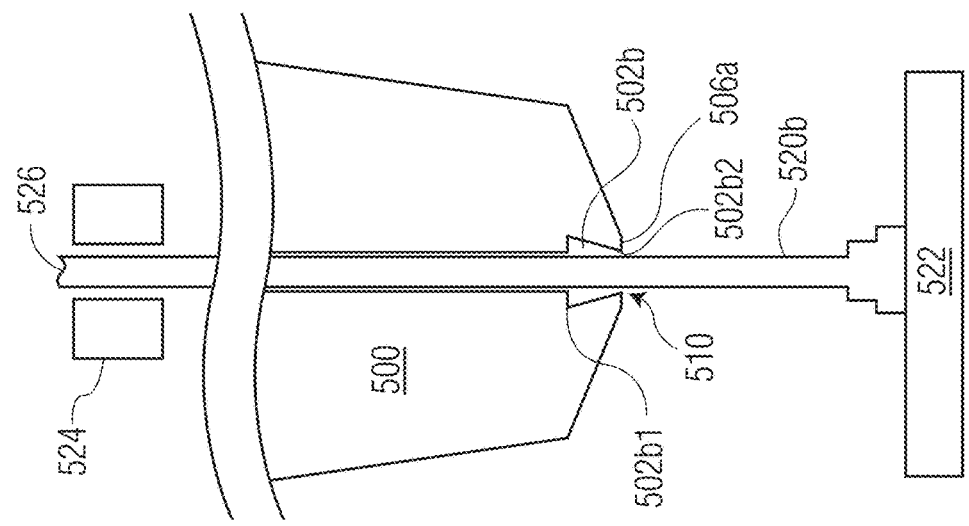
Figure 5A:
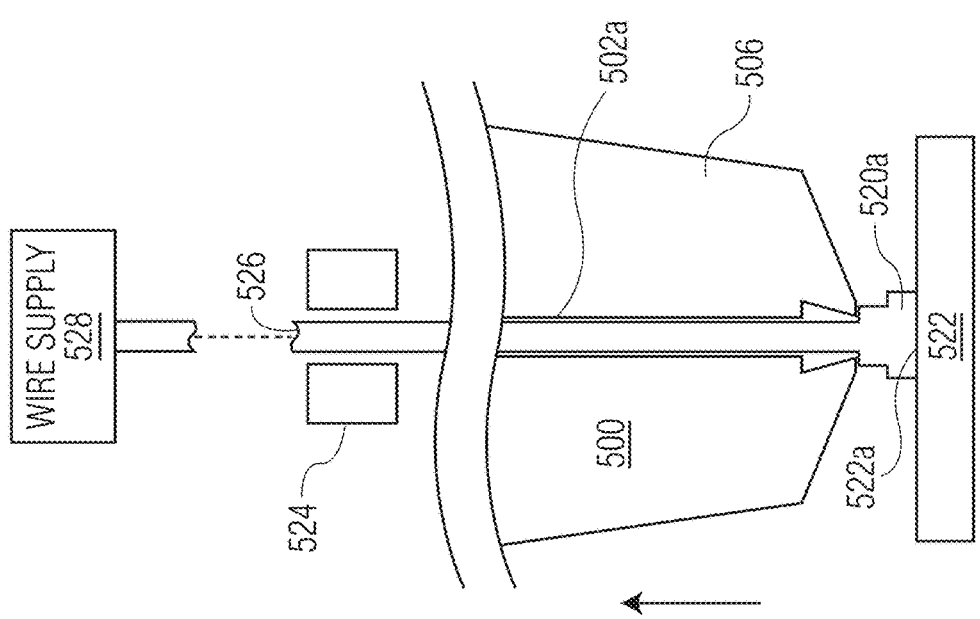
Figure 5F:
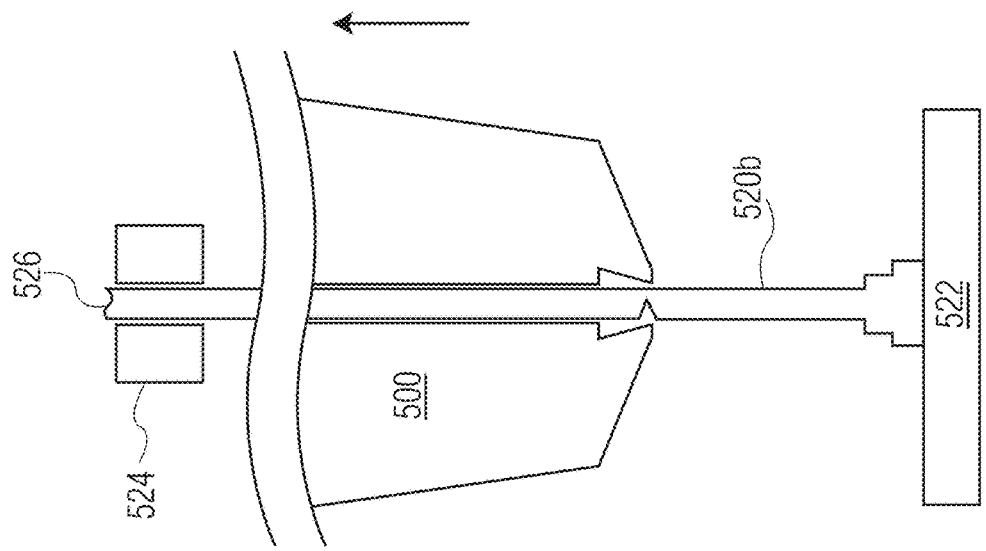

FIG. 5A illustrates now formed wire bond 520a, and wire bonding tool 500 being moved upward (see upward arrow). In FIG. 5B, wire bonding tool 500 and wire clamp 524 (in an open position) have been moved upward while extending a length of wire 520b from wire bond 520a, until bonding tool 500 reaches a predetermined position above wire bond 520a. Such a position may be considered to be a top of loop (i.e., TOL) position in conventional wire looping terminology. Length of wire 520b is continuous with wire bond 520a and is illustrated extending through a cavity 502b of wire bonding tool 500. As illustrated, cavity 502b has a diameter that varies along its length, the diameter of cavity 502b being larger than a diameter of through hole 502a. Cavity 502b defines diameter 502b1 (i.e., cavity diameter adjacent to through hole 502a) and diameter 502b2 (i.e., cavity diameter adjacent to working face 506a), where diameter 502b1 is larger than diameter 502b2. Feature 510 (e.g., a cutting feature, an edge portion, a pointed edge, etc.) is defined at least partially by cavity 502b of wire bonding tool 500. Feature 510 may be configured to partially sever wire 526 during a wire bonding operation. In FIG. 5C, wire clamp 524 is closed, and then wire bonding tool is moved (e.g., horizontally, to the right as shown by the arrow in FIG. 5C).

Figure 5E:
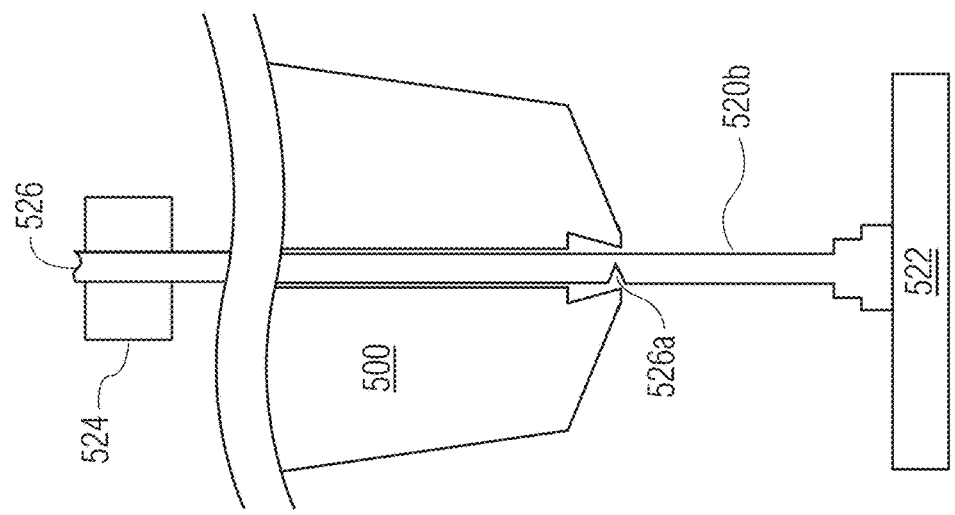
Figure 5D:
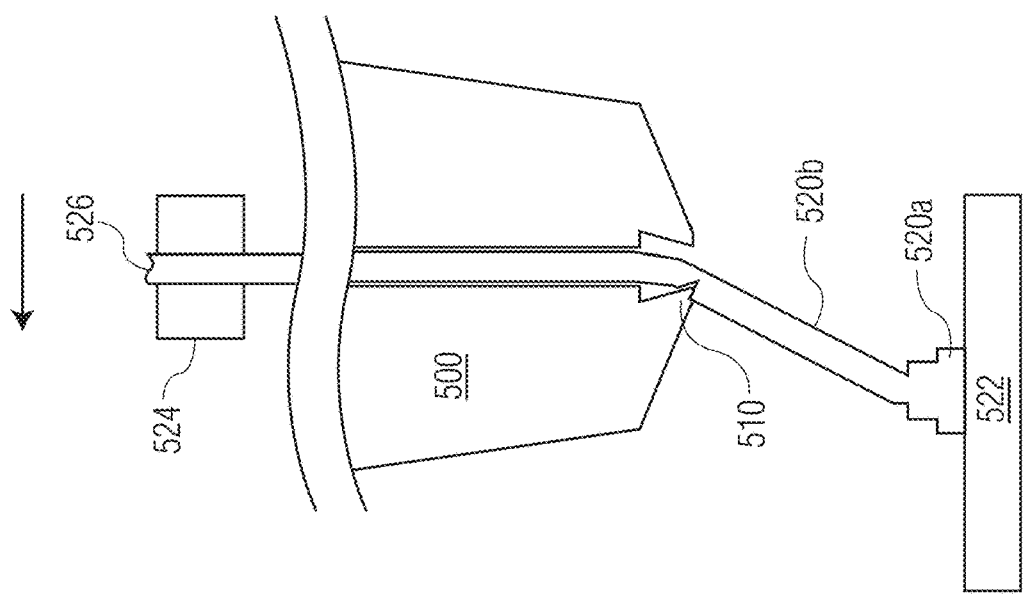
Figure 5G:
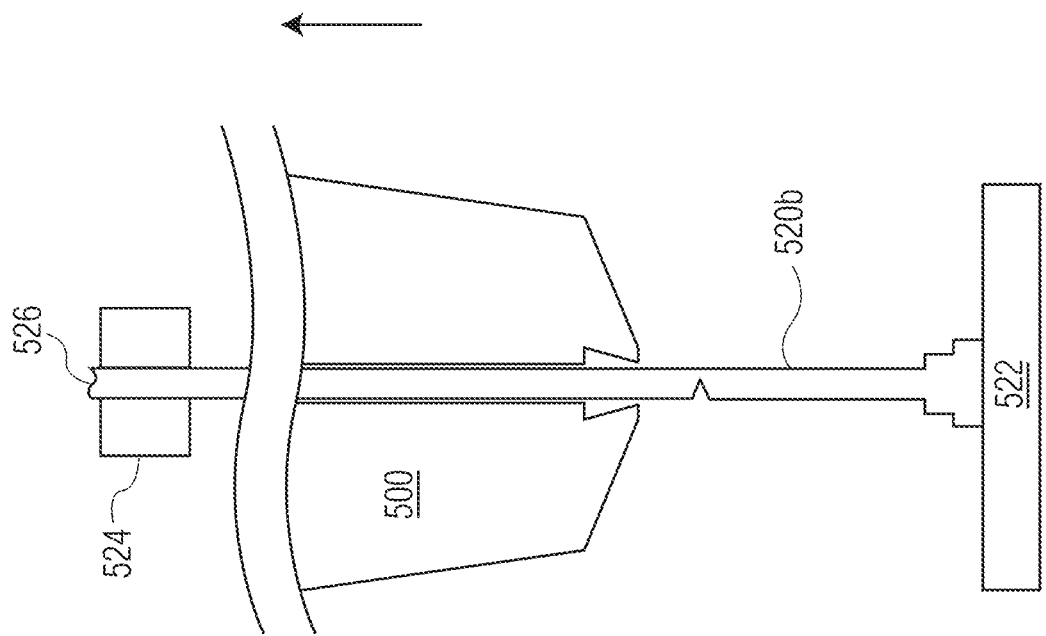
Figure 5H:
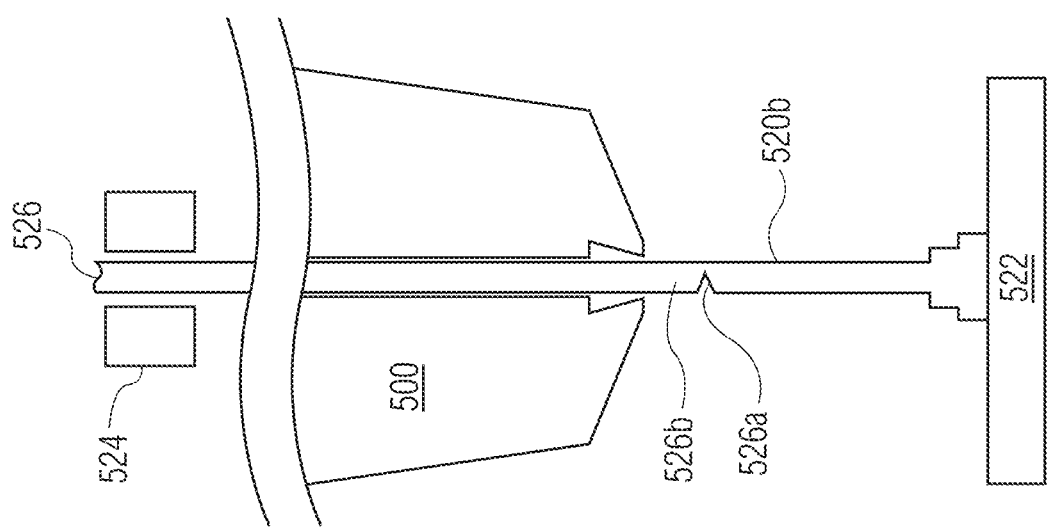

In FIG. 5D, wire bonding tool 500 has been moved (e.g., moved through at least one substantially horizontal motion) to contact length of wire 520b, at a position along length of wire 520b, to partially sever length of wire 520b at the position. For example, a feature 510 (e.g., a cutting feature, an edge portion, a pointed edge, etc.) may be used to contact (and partially sever) wire 526 (thereby forming cut 526a). After this contact (and partial severing of wire 526), wire bonding tool is moved (e.g., horizontally, to the left as shown by the arrow in FIG. 5D) back to a position above wire bond 520a. In FIG. 5E wire bonding tool 500 has been returned to the predetermined position (e.g., the TOL position). Wire clamp 524 is opened in FIG. 5F, and the wire bonding tool is raised (e.g., see upward arrow in FIG. 5F). At FIG. 5G, wire bonding tool 500 has been raised to pay out another portion of wire 526b continuous with cut 526a. This portion of wire 526b will become wire tail 526b' as shown in FIG. 5I. As illustrated in FIG. 5H, wire clamp 524 is closed (against an upper portion of wire, not labelled), and wire bonding tool 500 is raised (see upward arrow in FIG. 5H). As illustrated in FIG. 5I, wire bonding tool 500 and wire clamp 524 have been raised to separate wire 526 (including wire tail 526b') (where wire 526 is part of wire supply 528 such as a wire spool) from the now formed wire interconnect structure 520. As shown in FIG. 5J, wire tail 526b' has now been formed into free air ball 526b" for forming a subsequent wire bond 520a for another wire interconnect structure 520. That is, the process shown in FIGS. 5A-5I may be repeated to form a plurality of wire interconnect structures 520.

Although the method of forming a wire interconnect structure illustrated in connection with FIGS. 5A-5J involve a wire bonding tool 500, it is appreciated that any wire bonding tool within the scope of the invention (e.g., wire bonding tools 200 and 300 illustrated and described herein, and any other wire bonding tool within the scope of the invention) may be used in connection with the method of FIGS. 5A-5J (and/or the method of FIG. 6).

Although FIGS. 5A-5J illustrate a wire bonding tool moving substantially to the right (horizontally) to partially sever the wire, the scope of the invention is not so limited to such movements. For example, the wire bonding tool could be moved down and then to the side; moved diagonally down and to the side; etc.

Figure 6:
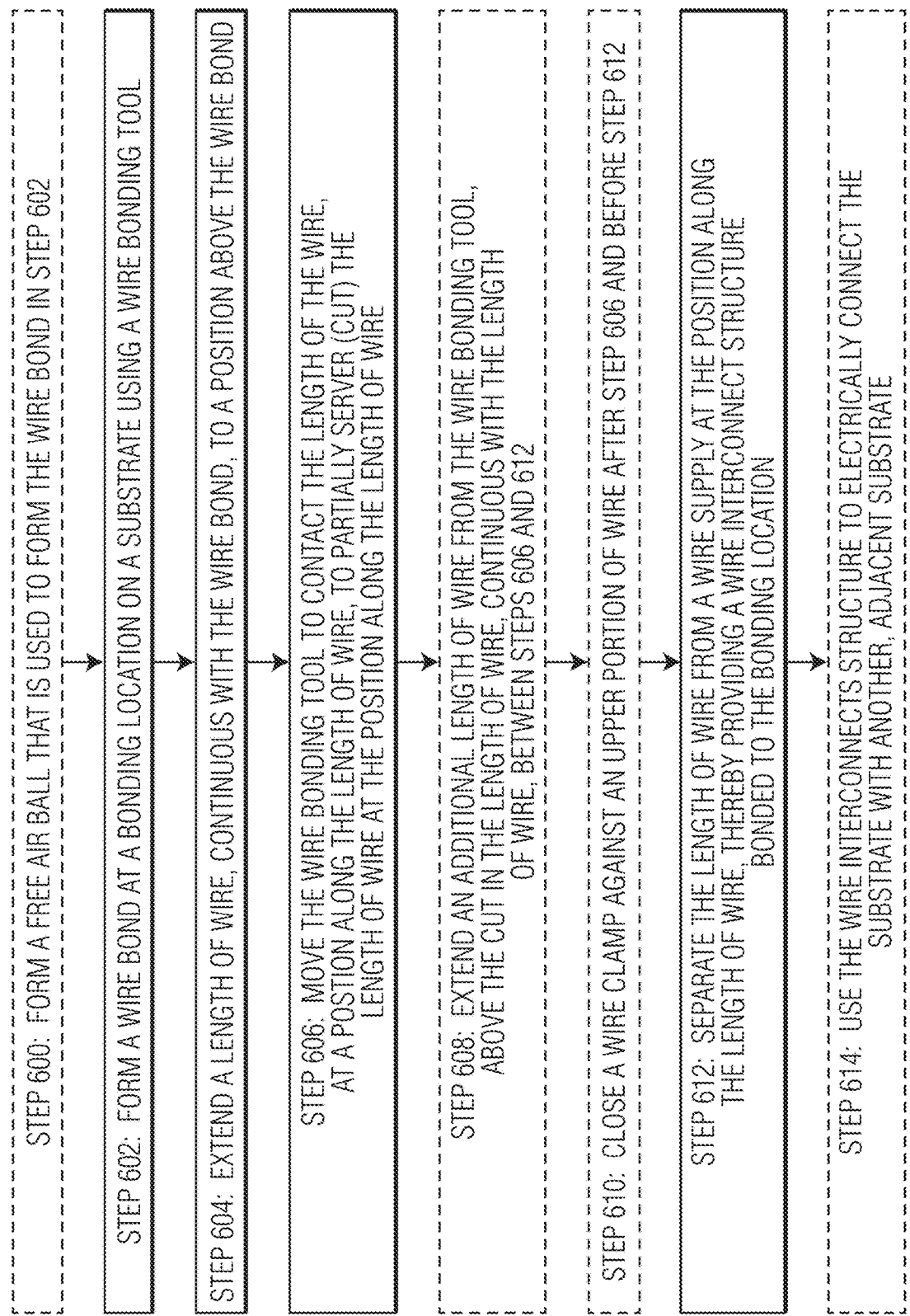
FIG. 6 is a flow diagram illustrating a method of forming a wire interconnect structure in accordance with an exemplary embodiment of the invention.

FIG. 6 is a flow diagram illustrating a method of forming a wire interconnect structure. As is understood by those skilled in the art, certain steps included in the flow diagrams may be omitted; certain additional steps may be added; and the order of the steps may be altered from the order illustrated-all within the scope of the invention.

Referring now to FIG. 6, at optional Step 600, a free air ball is formed that is used to form the wire bond in Step 602. At Step 602, a wire bond is formed at a bonding location on a substrate using a wire bonding tool (e.g., where a bonding force and ultrasonic energy are used in forming the wire bond) (e.g., see wire bond 520a in FIG. 5A). At Step 604, a length of wire is extended, continuous with the wire bond, to a position above the wire bond (e.g., see length of wire 520*b* in FIG. 5B). At Step 606, the wire bonding tool is moved (e.g., horizontally) to contact the length of wire, at a position along the length of wire, to partially sever the length of wire at the position along the length of wire (e.g., see motion between FIGS. 5C-5D). Step 606 may include moving the wire bonding tool through at least one substantially horizontal motion (or a plurality of substantially horizontal motions) to contact the length of wire (e.g., using a pointed edge or cutting feature of a tip portion of the wire bonding tool; using an edge portion adjacent an inner chamfer of the wire bonding too; etc.), at the position along the length of wire, to partially sever the length of wire at the position along the length of wire (thereby forming a "cut" in the wire). At optional Step 608, an additional length of wire (e.g., another portion of wire 526*b* in FIG. 5G) is extended from the wire bonding tool, above the cut in the length of wire, continuous with the length of wire, between Steps 606 and 612. At optional Step 610, a wire clamp is closed against an upper portion of wire after Step 606 and before Step 612 (e.g., see FIG. 5H). At Step 612, the length of wire is separated from a wire supply at the position along the length of wire, thereby providing a wire interconnect structure bonded to the bonding location (e.g., where the separating of Step 612 includes raising the closed wire clamp and the wire bonding tool in separating the continuous length of wire from a wire supply at the position along the length of wire) (e.g., see FIG. 5I where wire interconnect structure 520 is provided). After Step 612, the wire interconnect structure may extend substantially vertical above the wire bond. At optional Step 614, the wire interconnect structure is used to electrically connect the substrate with another, adjacent substrate. Steps 602, 604, 606, and 612 (and/or any of optional Steps 600, 608, 610, and 614) may be repeated to form a plurality of wire interconnect structures.

Wire interconnect structures formed in accordance with the invention may have improved consistency in height and resultant wire tail lengths, as well as increased efficiency in production (e.g., an increase in unit per hour produced).

Wire interconnect structures formed in accordance with the invention may be used, for example, as contact structures in probe cards, as interconnects between die in stacked die applications, as interconnects in flip chip applications, as interconnects in through silicon via or through mold via applications, as interconnects between packages in POP (package on package) applications, as electrical shielding structures, amongst others.

Aspects of the invention as described herein relate to forming a cut in a wire, for example, through a substantially horizontal motion (or other motion) of a tip portion of a wire bonding tool against the wire. Such a process is simple in comparison to conventional techniques of weakening a wire at a given location. Thus, using the inventive techniques described herein, simpler and faster processes are provided.

The position at which the wire bonding tool moves to partially sever a wire (e.g., cut 526*a*) could be anywhere along the length of the wire (e.g., adjacent wire bond, above wire bond, etc.).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding tool comprising:
   a body portion defining a through hole extending along a length of the body portion, the through hole being configured to receive a length of wire, the through hole extending into a cavity at a tip portion of the wire bonding tool, the cavity having a diameter that varies along its length, the diameter of the cavity being larger than a diameter of the through hole, the diameter of the cavity being smaller at a working face of the wire bonding tool as compared to the diameter of the cavity adjacent the through hole.

2. The wire bonding tool of claim 1 wherein the wire bonding tool defines a cutting feature at the working face adjacent the cavity, the cutting feature being configured to partially sever a wire during a wire bonding operation.

3. The wire bonding tool of claim 1 wherein the wire bonding tool defines a pointed edge at the working face adjacent the cavity, the pointed edge being configured to partially sever a wire during a wire bonding operation.

* * * * *